(12) United States Patent
Fujikura

(10) Patent No.: US 10,707,309 B2
(45) Date of Patent: Jul. 7, 2020

(54) GAN LAMINATE AND METHOD OF MANUFACTURING THE SAME

(71) Applicants: SCIOCS COMPANY LIMITED, Ibaraki (JP); SUMITOMO CHEMICAL COMPANY, LIMITED, Tokyo (JP)

(72) Inventor: Hajime Fujikura, Ibaraki (JP)

(73) Assignees: SCIOCS COMPANY LIMITED, Ibaraki (JP); SUMITOMO CHEMICAL COMPANY, LIMITED, Tokyo (JP)

(*) Notice: Subject to any disclaimer, the term of this patent is extended or adjusted under 35 U.S.C. 154(b) by 9 days.

(21) Appl. No.: 16/284,473

(22) Filed: Feb. 25, 2019

(65) Prior Publication Data

US 2019/0273138 A1   Sep. 5, 2019

(30) Foreign Application Priority Data

Mar. 2, 2018 (JP) .................. 2018-037474

(51) Int. Cl.
*H01L 29/20* (2006.01)
*H01L 21/02* (2006.01)
(Continued)

(52) U.S. Cl.
CPC .... *H01L 29/2003* (2013.01); *H01L 21/02389* (2013.01); *H01L 21/2003* (2013.01);
(Continued)

(58) Field of Classification Search
CPC ............................................. H01L 21/02389
See application file for complete search history.

(56) References Cited

U.S. PATENT DOCUMENTS

| 6,447,604 | B1 * | 9/2002 | Flynn ..................... C30B 25/00 117/89 |
| 2003/0080384 | A1 * | 5/2003 | Takahashi ......... H01L 29/66068 257/347 |

(Continued)

OTHER PUBLICATIONS

Oshima, Yuichi, et al., "Freestanding GaN wafers produced by void-assisted separation", the Hitahchi densen, No. 26 (Jan. 2007), pp. 31-36.

*Primary Examiner* — Thao P Le
(74) *Attorney, Agent, or Firm* — Pearne & Gordon LLP

(57) ABSTRACT

To provide a new GaN laminate obtained b growing a GaN layer on a GaN substrate by HVPE, including: a GaN substrate containing GaN single crystal and having a low index crystal plane as c-plane closest to a main surface; and a GaN layer epitaxially grown on the main surface of the GaN substrate wherein a surface of the GaN layer has a macro step-macro terrace structure in which a macro step and a macro terrace are alternately arranged, one of the macro step and the macro terrace has a step-terrace structure in which a step having a height of equal to or more than a plurality of molecular layers of GaN and extending in a direction orthogonal to m-axis direction, and a terrace are alternately arranged, and the other one of the macro step and the macro terrace has a step-terrace structure in which a step having a height of equal to or more than a plurality of molecular layers of GaN and extending in a direction orthogonal to a-axis direction, and a terrace are alternately arranged.

10 Claims, 9 Drawing Sheets

(51) Int. Cl.
*H01L 29/04* (2006.01)
*H01L 21/20* (2006.01)
*H01L 29/22* (2006.01)
*H01L 33/00* (2010.01)

(52) U.S. Cl.
CPC .......... *H01L 21/2018* (2013.01); *H01L 29/04* (2013.01); *H01L 29/2203* (2013.01); *H01L 33/0025* (2013.01)

(56) References Cited

U.S. PATENT DOCUMENTS

| | | | |
|---|---|---|---|
| 2008/0067522 A1* | 3/2008 | Udagawa | H01L 21/02609 257/76 |
| 2009/0194847 A1* | 8/2009 | Fujiwara | H01L 21/02658 257/615 |
| 2012/0012984 A1* | 1/2012 | Shimodaira | C30B 29/403 257/615 |
| 2012/0034149 A1* | 2/2012 | Fujiwara | C30B 29/406 423/409 |
| 2016/0380045 A1* | 12/2016 | Machuca | H01L 29/7786 257/52 |
| 2017/0047223 A1* | 2/2017 | Wang | H01L 29/20 |
| 2017/0338112 A1* | 11/2017 | Iso | H01L 21/02576 |

\* cited by examiner

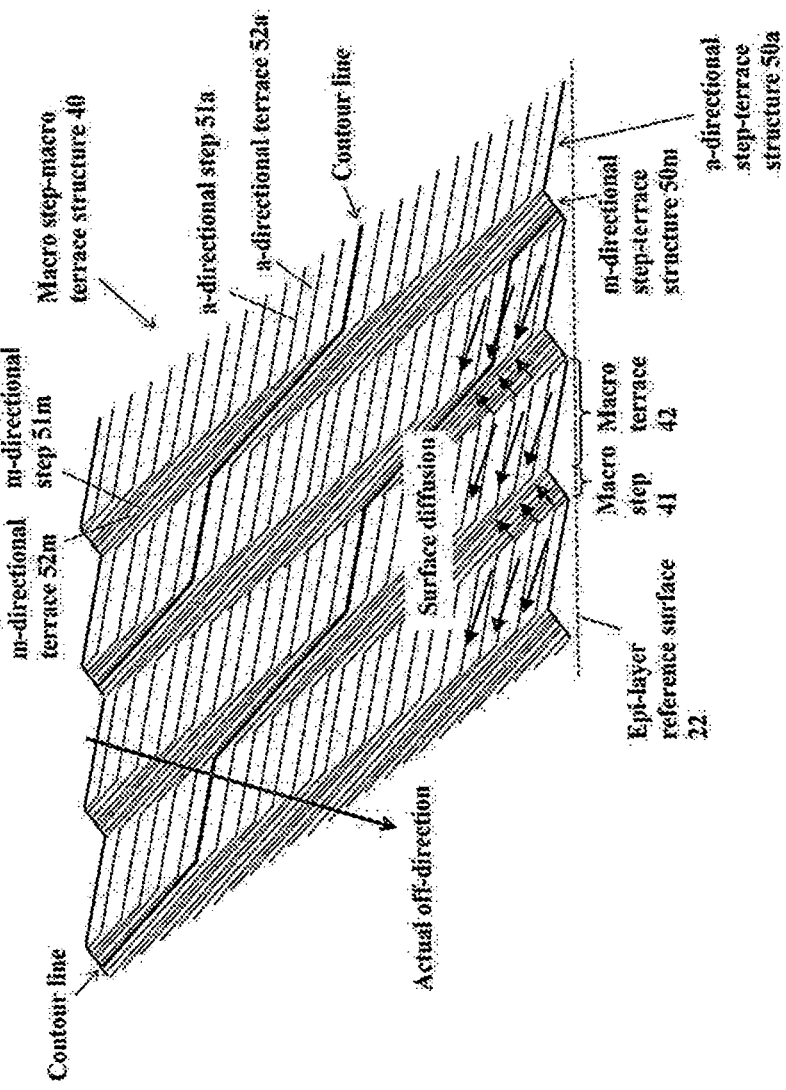

m-directional off 0.3° m-directional off 0.55°

AFM 5μm□

Bunching

GAN LAMINATE AND METHOD OF MANUFACTURING THE SAME

TECHNICAL FIELD

The present invention relates to a GaN laminate and a method of manufacturing the same.

DESCRIPTION OF RELATED ART

Gallium nitride (GaN) is used as a material for manufacturing semiconductor devices such as light-emitting elements and transistors. A GaN laminate obtained by epitaxially growing a GaN layer on a GaN substrate is attracting attention because the GaN layer is of high quality (For example, see Non-Patent Document 1 for the application of the GaN substrate for high quality growth of the GaN layer).

For example, in order to improve a withstand voltage of a semiconductor device manufactured using the GaN laminate, a thickness of the GaN layer grown on the GaN substrate is desired to be 10 µm or more. As a technique for growing such a thick GaN layer on the GaN substrate, the present inventors propose to use hydride vapor phase epitaxy (HVPE) capable of obtaining a high growth rate compared to metalorganic vapor phase epitaxy (MOVPE) and the like.

[Non-Patent Document 1] Yuichi Oshima, five others, "GaN Substrate by Void Formation Peeling Method", Hitachi Cable Ltd. No. 26 (2007-1), p. 31-36

It is not known very well hat kind of GaN laminate is obtained, by growing the GaN layer on the GaN substrate by HVPE.

An object of the present invention is to provide a new GaN laminate obtained by growing a GaN layer on a GaN substrate by and a manufacturing method for obtaining such a GaN laminate.

Summary of the Invention

According to an aspect of the present invention, there is provided a GaN laminate including:

a GaN substrate containing GaN single crystal and having a low index crystal plane as c-plane closest to a main surface; and a GaN layer epitaxially grown on the main surface of the GaN substrate, wherein a surface of the GaN layer has a macro step-macro terrace structure in which a macro step and a macro terrace are alternately arranged, one of the macro step and the macro terrace has a step-terrace structure in which a step having a height of equal to or more than a plurality of molecular layers of GaN and extending in a direction orthogonal to m-axis direction, and a terrace are alternately arranged, and the other one of the macro step and the macro terrace has a step-terrace structure in which a step having a height of equal to or more than a plurality of molecular layers of GaN and extending in a direction orthogonal to a-axis direction, and a terrace are alternately arranged.

According to other aspect of the present invention, there is provided a method of manufacturing a GaN laminate, including:

preparing a GaN substrate containing GaN single crystal and having a low index crystal plane as c-plane closest to a main surface; and epitaxially growing a GaN layer on the main surface of the GaN substrate by HVPE, wherein in epitaxially growing the GaN layer, the GaN layer is grown, with a growth temperature set to 950° C. or more and 1200° C. or less, and a macro step-macro terrace structure is formed on the surface of the GaN layer, in which a macro step and a macro terrace are alternately arranged, one of the macro step and the macro terrace has a step-terrace structure in which a step having a height of equal to or more than a plurality of molecular layers of GaN and extending in a direction orthogonal to m-axis direction, and a terrace are alternately arranged, and the other one of the macro step and the macro terrace has a step-terrace structure in which a step having a height of equal to or more than a plurality of molecular layers of GaN and extending in a direction orthogonal to a-axis direction, and a terrace are alternately arranged.

Advantage of the Invention

A new GaN laminate is provided. A method for obtaining such a GaN laminate is provided.

BRIEF DESCRIPTION OF THE DRAWINGS

FIG. 6 is a schematic view of a macro step-macro terrace.

DETAILED DESCRIPTION OF THE INVENTION

Figure 1:
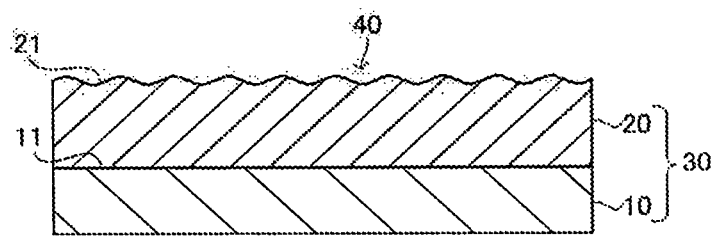
FIG. 1 is a schematic cross-sectional view showing a laminate according to an embodiment of the present invention.

A gallium nitride (GaN) laminate 30 according to an embodiment of the present invention will be described. FIG. 1 is a schematic cross-sectional view showing a GaN laminate 30. The GaN laminate 30 (also referred to as a laminate 30) has a GaN substrate 10 (also referred to as a substrate 10), and a GaN layer 20 (also referred to as an epi-layer 20) epitaxially grown on the substrate 10.

The substrate 10 contains GaN single crystal. The substrate 10 has a main surface 11, and the main surface 11 is a polished flat surface. A low index crystal plane closest to the main surface 11 is a c-plane of GaN single crystal constituting the substrate 10. Further, the c-plane may be a so-called +c-plane having a Ga polarity or a −c-plane having a nitrogen polarity. An angle formed by c-axis direction at a certain position in the main surface 11, and a normal direction of the main surface 11 (more specifically, a direction normal to the center of the main surface 11) is an off-angle of the substrate 10 at this position. A central off-angle, which is an off-angle at the center of the principal surface 11, is formed, for example, so as to be inclined in a-axis direction (also referred to as a-direction), and also formed, for example, so as to be inclined in m-axis direction (also referred to as m-direction).

Inclination of the off-angle in the a-direction means that an angle formed by the a-direction and the off-direction which is the direction of the off-angle is less than ±15°, preferably within ±10°, more preferably within ±5° in plan view of the substrate 10 (in plan view of the main surface 11). Similarly, inclination of the off-angle in the m-direction means that an angle formed by the m-direction and the off-direction which is the direction of the off-angle is less than ±15°, preferably within ±10°, more preferably within ±5° in plan view of the main surface 11. "The off-angle is inclined in a-direction" and "the off-angle is inclined in m-direction" respectively are also referred to as "the off-direction corresponds to a-direction" and "the off-direction corresponds to m-direction".

The epitaxial layer 20 is a GaN layer epitaxially grown on the main surface 11 of the substrate 10. For example, in order to improve a withstand voltage of a semiconductor device manufactured using the laminate 30, a thickness of the epi-layer 20 is preferably 10 μm or more. In order to grow a thick epi-layer 20 of 10 μm or more at high speed, hydride vapor phase epitaxy (HVPE) may be used as a growth method of the epi-layer 20.

It is found by the inventors of the present invention that a unique ridge-like structure is sometimes formed on the surface of the GaN layer grown on the GaN substrate by HVPE. More specifically, it is found that such a ridge-like structure is more likely to be formed, when a thick GaN layer of 10 μm or more is grown in a predetermined condition range, for example, at a growth rate of 0.3 μm/min or more and 3.0 μm/minute or less. As will be described in detail later, in this specification, such a unique ridge-like structure is referred to as a "macro step-macro terrace structure". In order to avoid complicated description, the term "step-terrace structure" may be abbreviated as "step-terrace".

It is unknown how the macro step-macro terrace affects a performance of the semiconductor device manufactured using the laminate 30. There is a possibility that the macro step-macro terrace may improve the performance of the semiconductor device and there is also a possibility that the macro step-macro terrace may deteriorate the performance of the semiconductor device. Therefore, as will be described in detail in the experimental examples described later, the present inventors study on a technique of promoting macro step-macro terrace formation, and a technique of suppressing macro step-macro terrace formation.

Based on such a study, in this embodiment, explanation will be given for the laminate 30 in which a macro step-macro terrace 40 is formed. More specifically, the laminate 30 according to the present embodiment has a macro step-macro terrace 40 on the surface 21 of the epi-layer 20.

As shown in FIG. 6 described later, the macro step-macro terrace 40 is interpreted as a structure in which macro step 41 including m-directional step-terrace 50m, and macro terrace 42 including a-direction step-terrace 50a, are alternately arranged. It is presumed that the m-directional step-terrace 50m and the a-directional step-terrace 50a have different various characteristics (For example, ease of incorporation of impurities affecting conductivity, and an incorporation ratio of group III atoms during growth of a mixed crystal semiconductor such as InGaN and AlGaN etc.). Accordingly, the laminate 30 having the macro step-macro terrace 40 also has potential to be applied as a material for producing a new semiconductor device in which fine regions having different characteristics (for example, different conductivity and the like) are alternately arranged on the surface 21 of the epi-layer 20, for example, planar mixed crystal superlattice/doped superlattice structure and one dimensional confinement structure such as quantum wire.

Figure 2:
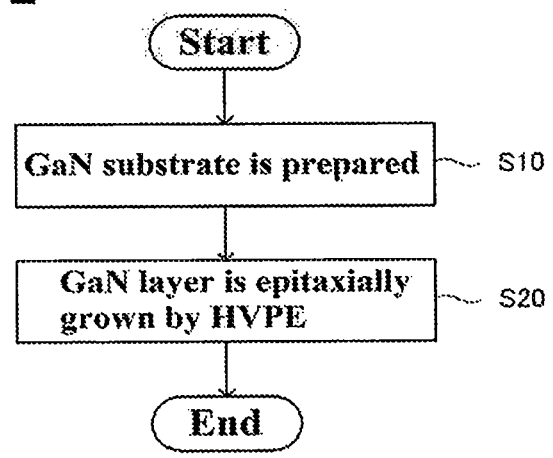
FIG. 2 is a flow chart schematically showing a method of manufacturing the laminate according to an embodiment.
Figure 3:
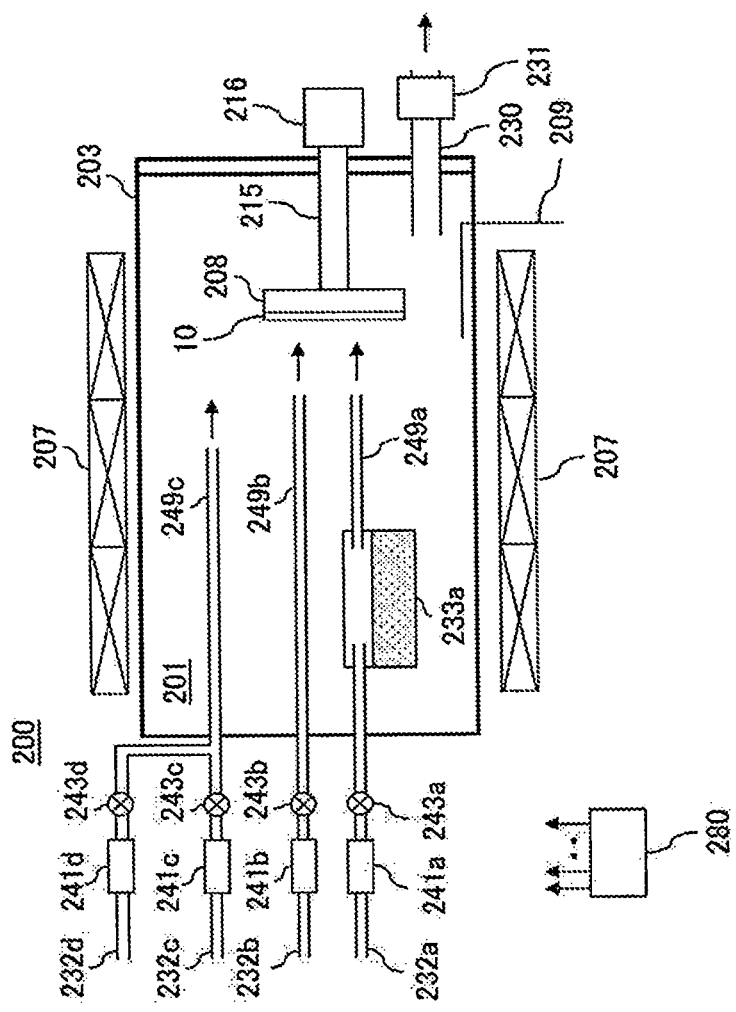
FIG. 3 is a schematic configuration view showing an HVPE apparatus.

FIG. 2 is a flow chart schematically showing a method of manufacturing the laminate 30. First, in step S10, the substrate 10 is prepared. Next, in step S20, the GaN layer 20 is epitaxially grown by HVPE on the main surface 11 of the substrate 10. Here, the HVPE apparatus 200 will be described. FIG. 3 is a schematic configuration view showing the HVPE apparatus.

The HVPE apparatus 200 is formed from a heat-resistant material such as quartz, and includes a hermetic container 203, the inside of which is provided with a film formation chamber 201. A susceptor 208 serving to hold the substrate 10 to be treated is provided inside the film formation chamber 201. The susceptor 208 is connected to a rotary shaft 215 of a rotary mechanism 216 and is configured to be rotatable. Gas supply pipes 232a through 232c serving to supply hydrochloric acid (HCl) gas, NH$_3$ gas, and nitrogen gas (N$_2$ gas) into the film formation chamber 201 are connected to one end of the hermetic container 203. A gas supply pipe 232d serving to supply hydrogen (H$_2$) gas is connected to the gas supply pipe 232c. Flow rate control devices 241a through 241d and valves 243a through 243d are provided respectively 011 the gas supply pipes 232a through 232d in that order from an upstream side. A gas generation device 233a that accommodates a Ga melt as a raw material is provided on the downstream of the gas supply pipe 232a. A nozzle 249a is connected to the gas generation device 233a. The nozzle 249a serves to supply gallium chloride (GaCl) gas produced by reaction between HCl gas and the Ga melt toward the substrate 10 held on the susceptor 208. Nozzles 249b and 249c are connected respectively to the downstream side of the gas supply pipes 232b and 232c. The nozzles 249b and 249c serve to supply various gases supplied from the gas supply pipes 232b and 232c toward the substrate 10 held on the susceptor 208. A gas discharge tube 230 serving to discharge the gas inside the film formation chamber 201 is provided on the other end of the hermetic container 203. A pump 231 is provided on the gas discharge tube 230. Zone heaters 207 serving to heal the inside the gas generation device 233a and the substrate 10 held on the susceptor 208 to desired temperatures are provided around the outer periphery of the hermetic container 203, and a temperature sensor 209 serving to measure the temperature inside the film formation chamber 201 is provided in the hermetic container 203. The members included in the HVPE apparatus 200 are connected to a controller 280 constituted as a computer and are configured such that processing procedures and processing conditions described later are controlled based on a program that is executed on the controller 280.

The growth processing of the GaN layer 20 may, for example, be implemented by the processing procedures below using the HVPE apparatus 200. First, Ga is accommodated in the gas generation device 233a as raw material. The substrate 10 is held on the susceptor 208. Then, N$_2$ gas is supplied into the film formation chamber 201 while heating and exhausting the inside the film formation chamber 201, and the inside the film formation chamber 201 is set in a desired growth pressure. At this time, in order to prevent roughening of the substrate surface before starting growth, supply of NH$_3$ gas is started from the gas supply pipe 232b, at a temperature of approximately 500° C. (preferably a temperature in a range of 400° C. to 550° C.). Then, after the temperature of the inside the film formation chamber 201 reaches a desired growth temperature, supply of H$_2$ gas is started, and when the atmosphere in the film formation chamber 201 is in a desired atmosphere, gas is supplied from the gas supply pipe 232a, thereby supplying GaCl gas to the substrate 10. The reason why starting supply of the H$_2$ gas immediately before supplying the GaCl gas is to prevent generation of roughing due to applying etching to the surface of the GaN substrate before growth when supply of the H$_2$ gas is started too early. It is preferable to start supply of the H$_2$ gas within 2 minutes after the temperature of the inside the film formation chamber 201 reaches a desired growth temperature, and it is preferable to supply GaCl gas within 1 minute after start of supply of the H$_2$ gas.

The following first condition range (also referred to as condition 1), second condition range (also referred to as condition 2), and third condition range (also referred to as condition 3) are exemplified as growth conditions of the GaN layer 20. V/III ratio is the ratio of a partial pressure of the nitrogen (N) source gas (NH$_3$ gas in this example) which is a group V source gas, with respect to a partial pressure of a gallium (Ga) source gas (in this example, GaCl gas) which is a group III source gas.

Growth conditions are exemplified as follows:

(V/III ratio)≤0.2 Tg−189 and (V/III ratio)≥0.2 Tg−199 as condition 1, (V/III ratio)<0.2 Tg−199 and (V/III ratio)≥0.2 Tg−209 as condition 2, (V/III ratio)<0.2 Tg−209 as condition 3, in a range of growth temperature Tg: 950° C. or more and 1200° C., or less, V/III ratio: 1 or more and 51 or less, a pressure inside the film formation chamber 201: 90 kPa or more and 105 kPa or less, preferably 90 kPa or more and 95 kPa or less, partial pressure of GaCl gas: 0.3 kPa or more and 1 5 kPa or less, and flow rate of N$_2$ gas/Flow rate of H$_2$ gas. 0 or more and 20 or less.

Figure 8:
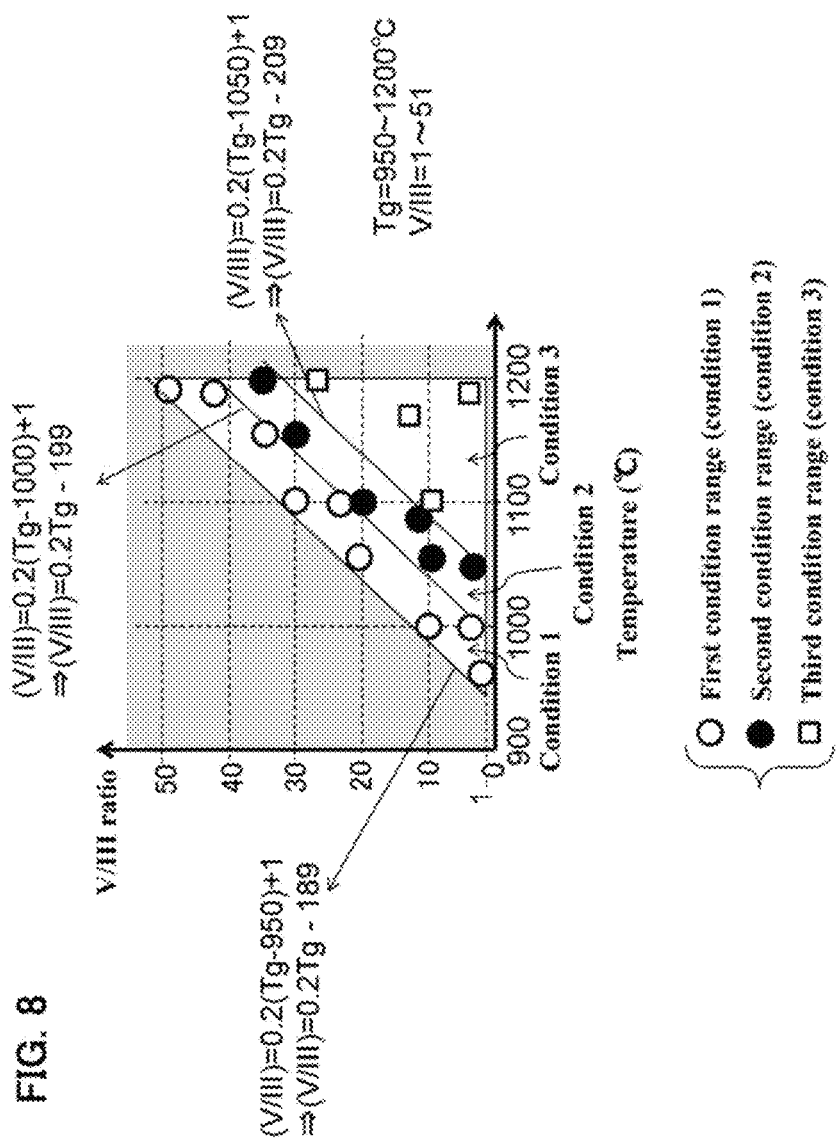
FIG. 8 is a graph showing first to third condition ranges in crystal growth treatment.

FIG. 8 is a graph showing the range of growth temperature Tg and V/III ratio corresponding to conditions 1, 2 and 3, in which a horizontal axis represents the growth temperature Tg, and a vertical axis represents the V/III ratio. In the condition range out of the conditions 1, 2 and 3 of FIG. 8 (condition range indicated by gray), a surface roughness or a disorderly ridge-like structure, etc., which is different from the unique ridge-like structure of the present invention, are generated.

Preferably, condition 1 or condition 2 is used, and more preferably condition 1 is used as the growth condition of the epi-layer 20 having the macro step-macro terrace 40. Namely, a relationship between the V/III ratio and the growth temperature Tg is preferably expressed as (V/III ratio)≤0.2 Tg−189 and (V/III ratio)≥0.2 Tg−209, and more preferably expressed as (V/III ratio)≤0.2 Tg−189 and (V/III ratio)≥0.2 Tg−199. The reason why condition 1 is more preferable is that the macro step-macro terrace 40 is more likely to be formed, and the macro step-macro terrace 40 can be formed irrespective of the off-angle of the substrate as will be described later, compared with condition 2. The growth rate is, for example, in a range of 0.3 μm/minute or more and 3.0 μm/minute or less.

Under condition 2, it is preferable to use the substrate 10 having a region in which the off-angle size in the main surface 11 is preferably 0.5° or less, more preferably 0.4° or less. This is because under condition 2, the smaller the off-angle, the easier the formation of the macro step-macro terrace 40. In contrast, under condition 1, the macro step-macro terrace 40 can be formed irrespective of the off-angle size. Under either condition 1 or condition 2, the macro step-macro terrace 40 can be formed irrespective of the off-direction.

After growth of the GaN layer 20 having a predetermined thickness, preferably a thickness of, for example, 10 μm or more, supply of the GaCl gas used for the growth processing is stopped, and the temperature inside the film formation chamber 201 is lowered to a temperature (near room temperature) at which an unloading operation can be performed. In this process, in order to protect the surface of epi-layer 20, it is preferable that supply of the NH$_3$ gas is continued until the temperature reaches about 500° C. (preferably at a temperature in a range of 400° C. or more and 550° C. or less). Further similarly, in order to protect the surface of the epi-layer 20, supply of the H$_2$ gas is preferably stopped at the same time as stopping supply of the GaCl gas. Then, after replacing the atmosphere inside the film formation chamber 201 with N$_2$ gas to return to the atmospheric pressure, the substrate 10 with the epi-layer 20 formed thereon, that is, the laminate 30 is unloaded from inside the film formation chamber 201. In this way, the laminate 30 having the macro step-macro terrace 40 on the surface 21 of the epi-layer 20 is manufactured.

Experimental Examples

Hereinafter, experimental examples will be described. In the experimental examples, a laminate with the epi-layer having a thickness of 10 μm or more grown on a substrate by HVPE is produced, and the surface state of the epi-layer was checked. Resulting finding is as follows: it is possible to separately form the laminate having the macro step-macro terrace on the surface of the epi-layer, and form the laminate having step-terrace which is flatter than the macro step-macro terrace on the surface of the epi-layer. The laminate of either of these forms is also the GaN laminate having a new structure found by the present inventors.

In the experimental example, GaN single crystal substrate was used as a substrate, the GaN single crystal substrate being manufactured by void-forming peeling (VAS) method and having a diameter of 2 inches (5.08 cm) and an in-plane threading dislocation density (TDD) of 1 to 3×10$^6$/cm$^2$. A plurality of substrates were used, each having off-direction and the central off-angle size different from each other. Specifically, substrates in which the off-direction of the central off-angle corresponds to a-direction, and substrates in which the off-direction of the central off-angle corresponds to m-direction were used, and substrates with the central off-angle size varied in a range of about 0.2° to about 0.6° were used. An epi-layer was formed on each substrate by epitaxially growing GaN by HVPE, and a region in the vicinity of the center of the epi-layer was observed, whose off-angle and off-direction were already known. Since the VAS method is used, the substrate can be manufactured in order not to form a region where the threading dislocation density is locally very high, for example, a region having 1×10$^7$/cm$^2$ or more. Therefore, it is preferable to use the substrate manufactured by the VAS method in order to enhance homogeneity in the plane of the epi-layer to be grown.

First, the macro step-macro terrace will be described, with reference to FIGS. 4A to 4E, FIG. 5 and FIG. 6. FIG. 4A to 4E are views showing surface states of the epi-layer of the laminate having macro step-macro terrace. The laminate shown in FIG. 4A to FIG. 4E was manufactured by growing the epi-layer having a thickness of 30 μm under condition 1 on the substrate in which the off-direction corresponds to a-direction and the size of the central off-angle is 0.4°. FIG. 5 is an enlarged view of FIG. 4A. FIG. 6 is a schematic view of the macro step-macro terrace.

Figure 4C:
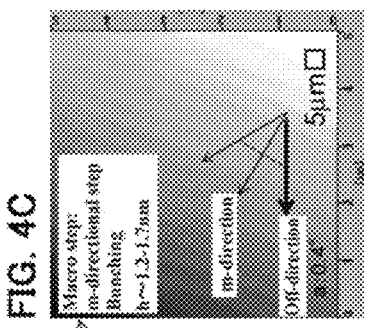
FIG. 4A to 4E are views showing a surface state of an epi-layer of a laminate having a macro step-macro terrace according to an experimental example, respectively.
Figure 4D:
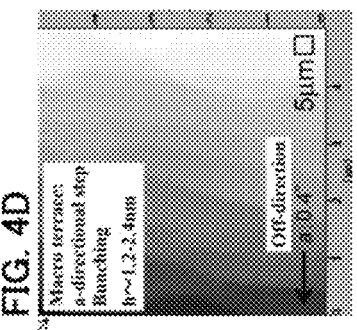
Figure 4B:
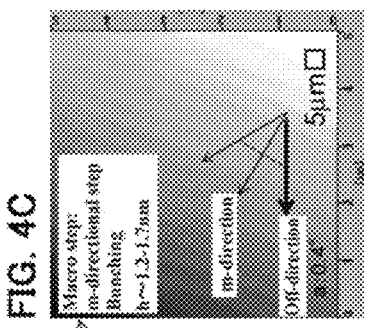
Figure 4A:
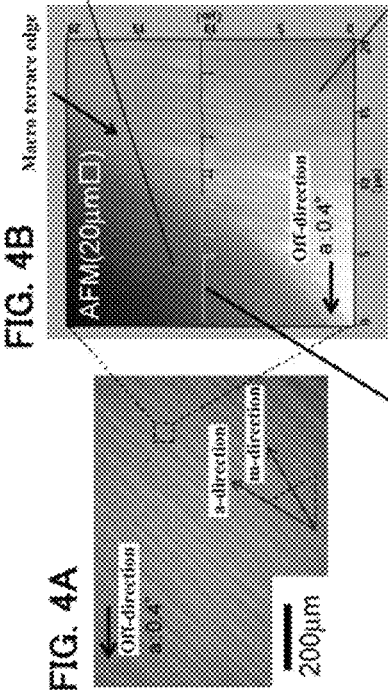
Figure 4E:
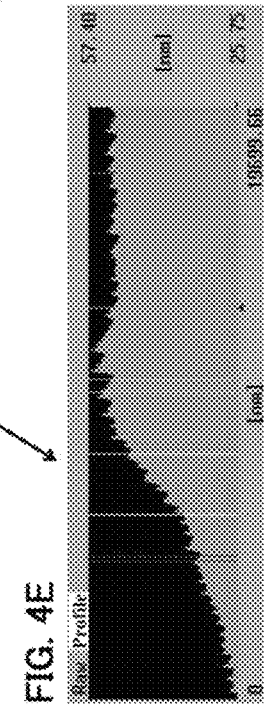
Figure 5:
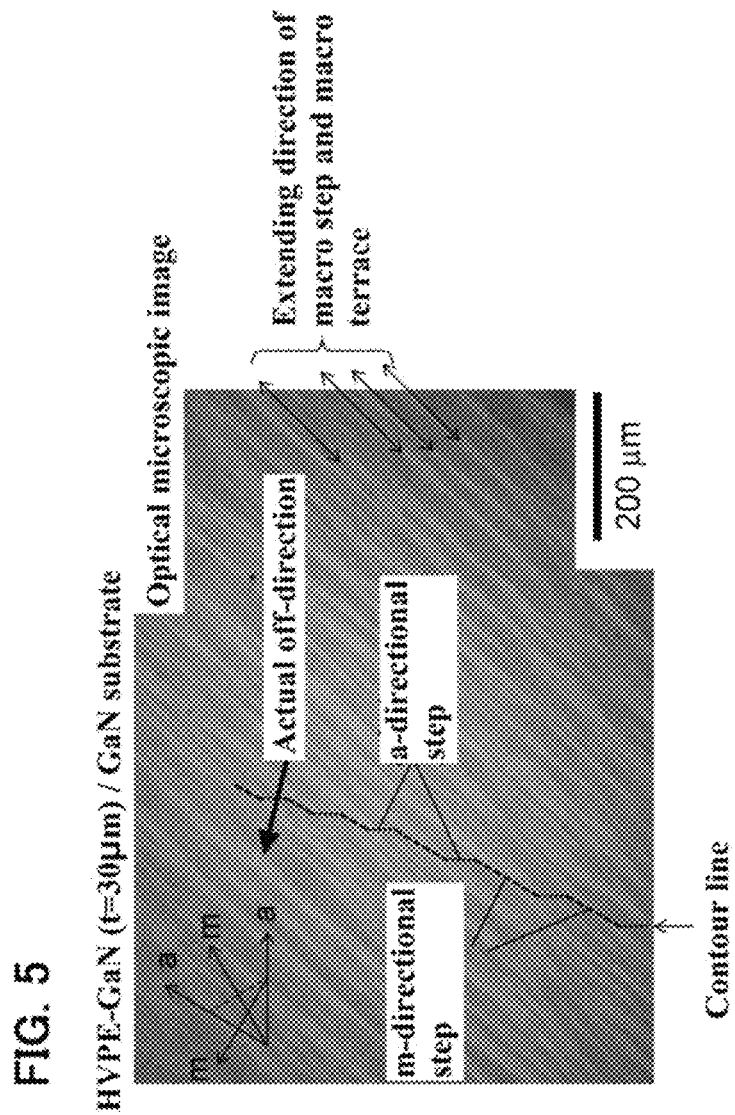
FIG. 5 is an enlarged view of FIG. 4A.

FIG. 4A is an optical microscopic image of the epi-layer surface, FIG. 4B is an atomic force microscope (AFM) image of a region of 20 μm square on the epi-layer surface, FIG. 4C is an AFM image of a region of 5 μm square in the macro step, and FIG. 4E is an AFM line profile along a line shown in the center of FIG. 4B.

As shown in FIG. 4A, a unique ridge-like structure extending in an intermediate direction between a-direction and m-direction is observed on the epi-layer surface. Such a ridge-like structure was formed on the entire surface of the epi-layer. It was found by the present inventors that the ridge-like structure observed in FIG. 4A is schematically understood as the macro step-macro terrace 40 in which a macro step 41 and a macro terrace 42 are alternately arranged, as shown in FIG. 6. Namely, it is found that the epi-layer surface of the laminate shown in FIGS. 4A to 4E is a surface having a macro step-macro terrace. The macro step-macro terrace observed in FIG. 4A is a state of 90° rotation of FIG. 6 in the page.

The direction and the interval of a striped pattern observed in the AFM image are different, interposing a boundary area indicated as "macro terrace edge" in FIG. 4B The macro terrace edge corresponds to a boundary between the macro terrace 42 and the macro step 41 shown in FIG. 6.

FIG. 4C is an enlarged AFM image of the inside the macro step arranged to the left of the macro terrace edge. A striped pattern with a narrow interval (as compared with the image in FIG. 4D) is observed so as to extend in a direction approximately orthogonal to m-direction. As shown in FIG. 6, the macro step 41 is schematically understood as a surface having a step-terrace structure in which m-directional step 51m which is the step extending in a direction orthogonal to m-direction, and in-directional terrace 52m which is the terrace extending in a direction orthogonal to m-direction are alternately arranged. Further, the macro step 41 is schematically understood as a surface extending in the intermediate direction between the a-direction and the m-direction. A step-terrace where the m-directional step 51m and the m-directional terrace 52m are alternately arranged, is referred to as m-directional step-terrace 50m. In FIG. 6, the m-directional step 51m is indicated by line.

The height of each m-directional step 51m is, for example, about 1.2 to 1.7 nm. Since the thickness of monolayer of GaN is about 0.26 nm, the m-directional step 51 in is the step having a height of equal to or more than a plurality of molecular layers of GaN, for example, a height of about 4 to 7 layers of GaN, and is the step in which step bunching occurs in the m-direction.

FIG. 4D is an enlarged AFM image of the inside the macro terrace arranged to the right of the macro terrace edge, and a striped pattern with a wide interval (as compared with the image in FIG. 4C) is observed so as to extend in a direction approximately orthogonal to the a-direction corresponding to the off-direction. As shown in FIG. 6, the macro terrace 42 is schematically understood as a surface having a step-terrace in which a-directional step 51a which is the step extending in a direction orthogonal to the a-direction, and a-directional terrace 52a which is the terrace extending in a direction orthogonal to the a-direction, are alternately arranged. Further, the macro terrace 42 is schematically understood as a surface extending in the intermediate direction between the a-direction and the m-direction. The step-terrace where the a-directional step 51a and the a-directional terrace 52a are alternately arranged, is referred to as a-directional step-terrace 50a. In FIG. 6, the a-directional step 51a is indicated by line.

The height of each m-directional step 51a is, for example, about 1.2 to 2.4 nm. Accordingly, the a-directional step 51a has a height of equal to or more than a plurality of molecular layers of GaN, for example, a height of about 4 to 10 layers, and is the step in which step bunching occurs in the m-direction.

FIG. 4E shows a macro step-macro terrace line profile straddling the macro step on the left and the macro terrace on the right interposing the macro terrace edge shown in FIG. 4B. The profile shows that a stepped structure is formed in the macro step-macro terrace. Although it is difficult to understand from the line profile of FIG. 4E, as shown in FIG. 6, an inclination direction of the macro step 41 and an inclination direction of the macro terrace 42 with respect to a reference surface 22 of the epi-layer (the surface being defined as a surface with leveled unevenness of the macro step-macro terrace 40) are different from each other. A surface having the macro step 41, namely, the m-directional step-terrace 50m is a surface inclined by 0.5° or more and 0.7° or less with respect to the c-plane. A height of the peak-to-valley of unevenness formed by the macro step 41 and the macro terrace 42 is 10 nm or more.

Contour lines shown in FIG. 5 and FIG. 6 are lines connecting the m-directional step 51m of the macro step 41 and the a-directional step 51a of the macro terrace 42. In a plan view of the epi-layer (in plan view of the reference surface 22), it is presumed that a direction orthogonal to the direction in which the contour lines extend averagely is an actual off-direction. Therefore, the actual off-direction in the observed region is slightly deviated from a correct a-direction.

Figures 7A, 7B, 7C:
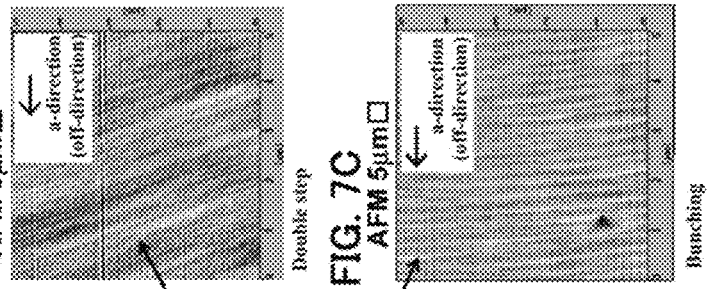
FIGS. 7A to 7C are views showing a surface state of the epi-layer in the laminate produced by changing epitaxial growth conditions and substrate off-angle conditions.

A relationship between epitaxial growth conditions and ease of macro step-macro terrace formation, and a relationship between substrate off-angle conditions and ease of macro step-macro terrace formation will be described next, with reference to FIG. 7A to FIG. 7C. FIG. 7A to FIG. 7C show a surface state of the epi-layer in the laminate produced by changing the epitaxial growth conditions and the substrate off-angle conditions.

A plurality of laminates shown in FIGS. 7A to 7C were produced as follows. Three types of substrates were used as substrates, in which the central off-angle sizes are 0.25°, 0.4° and 0.55°, and the off-directions of the central off-angles correspond to the a-direction, respectively. The laminate was produced by growing the epi-layer with a thickness of 30 μm on each kind of the above substrates, under plural growth conditions of conditions 1, 2, and 3. From FIG. 8, it is found that conditions 1, 2 and 3 are the same as the above-described conditions. Substantially the same results were obtained within each condition range of the conditions 1, 2 and 3, and therefore FIG. 7A to FIG. 7C show typical results in each condition range.

FIG. 7A shows an optical microscopic image of the epi-layer surface of each laminate together, FIG. 7B shows an AFM image of a region of 5 μm square on the epilayer surface of the laminate having the off-angle of 0.25° under a growth condition of condition 3, and FIG. 7C shows an AFM image of a region of 5 μm square on the epi-layer surface of the laminate having the off-angle of 0.4° under a growth condition of condition 3.

As shown in FIG. 7A, under condition 1, macro step-macro terrace is formed on the entire surface of the epi-layer regardless of any off-angle size. Under condition 2, the smaller the off angle, the easier it is to form the macro step-macro terrace, and when the off angle is 0.55°, almost no macro step-macro terrace is formed. This result reveals that under condition 2, the off-angle of the substrate is preferably 0.5° or less, more preferably 0.4° or less in order to form the macro step-macro terrace.

Under condition 3, regardless of any off-angle size, the macro step-macro terrace is not observed, and a flat epi-layer surface can be obtained compared to a case where the macro step-terrace is formed.

As shown in FIG. 7B, in the laminate having the off-angle of 0.25° under condition 3, a uniform striped pattern is observed in the AFM image. This shows that the epi-layer surface has the step-terrace in which a step and a terrace extending in a predetermined direction (fixed direction) are alternately arranged, and namely shows that the epi-layer surface is not a surface having two types of step-terrace (m-directional step-terrace and a-directional step-terrace) like a macro step-macro terrace, but a surface having one type of step-terrace. An optical microscopic image shown in FIG. 7A reveals the following matter: a region of at least 1 mm square or more on the epi-layer surface is constituted by one type of step-terrace, and similarly an optical microscopic image shown in FIG. 7C reveals the following matter, also in the laminate having the off-angle of 0.4° under condition 3, a uniform striped pattern is observed in the AFM image, and a region of at least 1 mm square or more on the epi-layer surface is constituted by one type of step-terrace.

In the laminate (laminate having an off-angle of 0.25°) shown in FIG. 7B and the laminate (laminate having an off-angle of 0.4°) shown in FIG. 7C, the epi-layer surface has a step-terrace in which a step having a height of equal to or more than a plurality of molecular layers of GaN and extending in a predetermined direction, and a terrace are alternately arranged. However, there are the following differences between the step-terrace of the laminate having the off-angle of 0.25° and the step-terrace of the laminate having the off-angle of 0.4°. The step of the laminate having the off-angle of 0.25° is a double step in which each step has a constant height of two molecular layers of GaN. In contrast, the step of the laminate having the off-angle of 0.4 is the step in which step bunching occurs, and having a height of approximately about 4 to 10 GaN layers in the a-direction. The step of the laminate having the off-angle of 0.4° extends in a direction approximately orthogonal to the a-direction corresponding to the off-direction. The flat epi-layer surface as compared with the macro step-macro terrace formation is schematically understood as a surface having such a step-terrace.

A case where the off-direction of the substrate corresponds to the m-direction will be described, with reference to FIG. 9A, FIG. 9B, and FIG. 10A to FIG. 10C. FIG. 9A, FIG. 9B, and FIG. 10A to FIG. 10C are views showing a surface state of the epi-layer in the laminate produced using a substrate in which the off-direction of the central off-angle corresponds to the m-direction. The laminate shown in FIGS. 9A and 9B (laminate having the off-angle of 0.3°) was produced by growing the epi-layer with a thickness of 30 μm under condition 1, on the substrate having the central off-angle size of 0.3° in the off-direction corresponding to the m-direction. The laminate shown in FIG. 10A to FIG. 10C (laminate having the off-angle of 0.55°) was produced by growing the epi-layer with a thickness of 30 μm under condition 2, on the substrate having the central off-angle size of 0.55° in the off-direction corresponding to the m-direction.

Figure 9A:
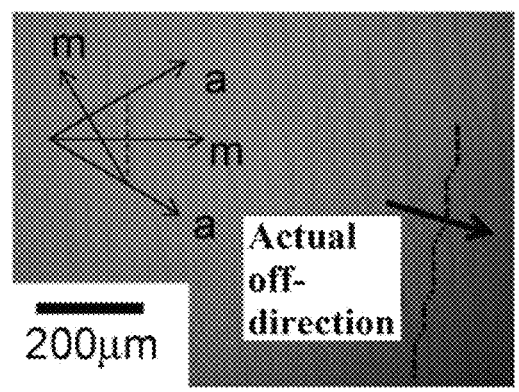
FIG. 9A and FIG. 9B are views showing a surface state of the epi-layer according to an experimental example, in a laminate produced using a substrate in which off-direction of a central off-angle corresponds to m-direction.
Figure 9B:
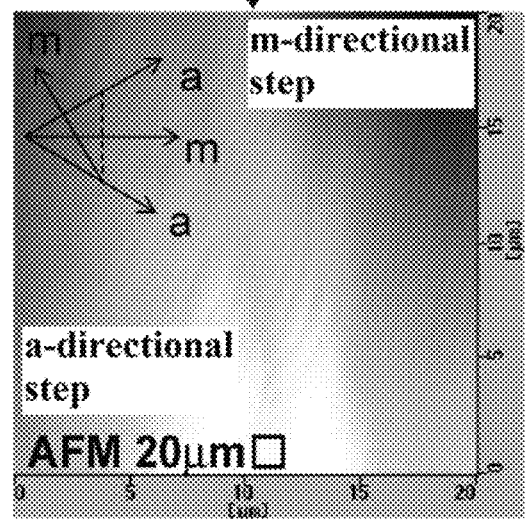

FIG. 9A is an optical microscopic image of the epi-layer surface in the laminate having the off-angle of 0.3°, and FIG. 9B is an AFM image of a region of 20 μm square on the epi-layer surface in the laminate having the off-angle of 0.3°.

As shown in FIG. 9A, the macro step-macro terrace is observed on the epi-layer surface. As shown in FIG. 9B, the macro step is observed on the right side and the macro terrace is observed on the left side interposing the macro terrace edge which is a boundary area. In the macro step, the m-directional step extending in the direction approximately orthogonal to the m-direction corresponding to the off-direction and having a narrow interval is observed, and in the macro terrace, the a-directional step extending in the direction approximately orthogonal to the a-direction and having a wide interval is observed. As described above, also in the case where the off-direction of the substrate corresponds to the m-direction, the macro step-macro terrace can be formed on the epi-layer surface, as in the case where the off-direction of the substrate corresponds to the a-direction.

Figure 10A:
FIG. 10A to FIG. 10C are views a surface state of the epi-layer according to an experimental example, in a laminate produced using a substrate in which off-direction of a central off-angle corresponds to m-direction.
Figure 10B:
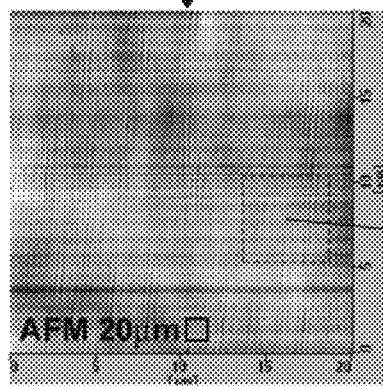
Figure 10C:
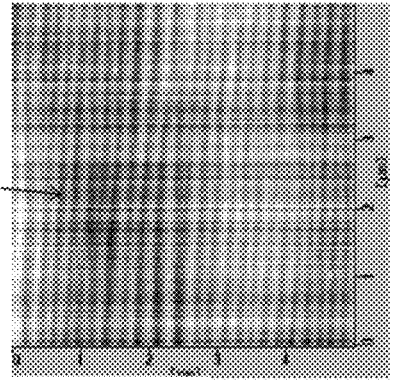

FIG. 10A is an optical microscopic image of the epi-layer surface in the laminate having the off-angle of 0.55°, FIG. 10B is an AFM image of a region of 20 μm square on the epi-layer surface in the laminate having the off angle of 0.55°, and FIG. 10C is an AFM image of a region of 5 μm square on the epi-layer surface in the laminate having the off angle of 0.55°.

As shown in FIG. 10A, the epi-layer surface is a flat surface having no macro step-macro terrace observed. As shown in FIG. 10B and FIG. 10C, a uniform striped pattern is observed in the AFM image, and it is found that the epi-layer surface is the surface having one type of step-terrace. From the optical microscopic image shown in FIG. 10A, it can be said that a region of at least 1 mm square or more on the epi-layer surface is constituted by one type of step-terrace. The observed step extend in a direction approximately orthogonal to the m-direction corresponding to the off-direction. Further, the step has a height of equal to or more than a plurality of molecular layers of GaN, and in the step, step bunching occurs in the m-direction. As described above, also in the case where the off-direction of the substrate corresponds to the m-direction, a flat epi-layer surface can be obtained compared with the case where the macro step-macro terrace is formed, as in the case where the off-direction of the substrate corresponds to the a-direction. Namely, the epi-layer surface can be formed not as a surface having two types of step-terrace (m-directional step/m-directional terrace and a-directional step/a-directional terrace) like the macro step-macro terrace, but as a surface having one type of step-terrace.

Regarding the formation of such a flat epi-layer, the following can be said. When comparing the laminate having the off-angle of 0.25° shown in FIG. 7B, the laminate having the off angle of 0.4° shown in FIG. 7C, and the laminate having the off-angle of 0.55° shown in FIG. 10C, it is presumed as follows: the off-angle of the substrate becomes large exceeding 0.3°, thereby increasing the force to align the extending direction of the step in the a-direction or in the direction orthogonal to the m-direction corresponding to the off-direction. Namely, in order to form the step-terrace so that the step extend in the direction orthogonal to the a-direction or the m-direction corresponding to the off-direction, it may be preferable to set the off-angle of the substrate to more than 0.3°.

Further, since the off-angle of the substrate becomes as small as 0.3° or less, a double step in which each step has a constant height of two molecular layers of GaN are likely to be formed, although a detailed reason is unknown. Namely, in order to form the step-terrace having the double step, it may be preferable to set the off-angle of the substrate to 0.3° or less.

As described above, it is possible to separately form the laminate having the macro step-macro terrace on the epi-layer surface, and the laminate having the step-terrace which is flatter than the macro step-macro terrace on the epi-layer surface. There is a tendency such that the lower the growth temperature, the easier the formation of the former laminate, and the higher the growth temperature, the easier the formation of the latter laminate. The reason therefore is presumed to be as follows.

As shown in FIG. 6, in order to form the macro step-macro terrace, atoms constituting GaN are required to diffuse to a predetermined position where the macro step-macro terrace is formed. As the temperature is higher, the atoms easily evaporate from the epi-layer surface, so surface diffusion hardly occurs. Therefore, it is considered that the macro step-macro terrace is less likely to be formed as the temperature becomes high, and the epi-layer surface becomes flat.

Actually observed macro step-macro terrace (see for example FIG. 4B and FIG. 9B), or actually observed step-terrace (see for example FIG. 7B, FIG. 7C and FIG. 10C) include fluctuations, and therefore these structures sometimes don't perfectly match the structure based on the above-described schematic understanding. However, based on the above-described schematic understanding, it is possible to grasp the characteristics of each of the macro step-macro terrace and the step-terrace.

Other Embodiments

As described above, embodiments of the present invention have been specifically described. However, the present invention is not limited to the above-described embodiments, and various modifications, improvements, combinations, and the like can be made without departing from the gist of the present invention.

In the above-described explanation, for the convenience of explanation, the macro step-macro terrace is described such that the surface constituted by the m-directional step-terrace is referred to as the macro step, and the surface constituted by the a-directional step-terrace is referred to as the macro terrace. Experimental examples (see FIGS. 4B and 9B) reveal a tendency such that the step interval (terrace width) in the macro step (m-directional step-terrace) and the step interval (terrace width) in the macro terrace (a-directional step-terrace) are different from each other, and more specifically reveal a tendency such that the step interval in the macro step (m-directional step-terrace) is narrower than the step interval in the macro terrace (a-directional step-terrace). However, depending on various conditions, there is a possibility that the step interval in the macro step (m-directional step-terrace) is wider than the step interval in the macro terrace (a-directional step-terrace). Further, depending on the off-angle and off-direction of the substrate, it is also presumed that the step direction of the macro step and the macro terrace is reversed. Namely, it is also possible to form a macro step-macro terrace having a macro terrace constituted by the m-directional step-terrace, and a macro step constituted by the a-directional step-terrace. In each case, the macro step-macro terrace is similarly constituted as a combination of two types of step-terrace as described above. In the surfaces of the macro step-macro terrace, each being constituted by two types of step-terrace, namely, in the macro step and the macro terrace, a wider one may be referred to as "a macro terrace", and a narrower one may be referred to as "a macro step" for convenience.

The laminate having the macro step-macro terrace on the epi-layer surface is not limited to the laminate having the macro step-macro terrace on the entire surface of the epi-layer, and may be the laminate having the macro step-macro terrace in a part of the epi-layer surface (for example, a region having a size of 1 mm square or more or a region having a width of 500 μm square or more).

The laminate having the step-terrace which is flatter than the macro step-macro terrace on the epi-layer surface is not limited to the laminate having the step-terrace on the entire surface of the epi-layer, and may be the laminate having the step-terrace in a part of the epi-layer surface (for example, a region having a size of 1 mm square or more or a region having a width of 500 μm square or more).

Impurities such as conductivity type determination impurities may be included in each of the substrate and the epi-layer of the laminate. The epi-layer may have one of the GaN layer containing n-type impurities and the GaN layer containing p-type impurities, or may have both.

Preferable Aspects of the Present Invention

Preferable aspects of the present invention will be supplementary described hereafter.
(Supplementary Description 1)
There is provided a GaN laminate, including:
a GaN substrate containing GaN single crystal and having a low index crystal plane as c-plane closest to a main surface; and
a GaN layer epitaxially grown on the main surface of the GaN substrate,
wherein a surface of the GaN layer has a macro step-macro terrace structure in which a macro step and a macro terrace are alternately arranged,
one of the macro step and the macro terrace has a step-terrace structure in which a step having a height of equal to or more than a plurality of molecular layers of GaN and extending in a direction orthogonal to m-axis direction, and a terrace are alternately arranged, and
the other one of the macro step and the macro terrace has a step-terrace structure in which a step having a height of equal to or more than a plurality of molecular layers of GaN and extending in a direction orthogonal to a-axis direction, and a terrace are alternately arranged.
(Supplementary Description 2)
There is provided the GaN laminate according to supplementary description 1, wherein the macro step and the macro terrace extend in an intermediate direction between m-axis direction and a-axis direction.
(Supplementary Description 3)
There is provided the GaN laminate according to supplementary description 1 or 2, wherein a step interval in the macro step and a step interval in the macro terrace are different from each other.
(Supplementary Description 4)
There is provided the GaN laminate according to any one of the supplementary descriptions 1 to 3, wherein the step interval in the macro step is narrower than the step interval in the macro terrace.

(Supplementary Description 5)
There is provided the GaN laminate according to any one of the supplementary descriptions 1 to 4, wherein the macro step is a surface inclined by 0.5° or more and 0.7° or less with respect to c-plane, the macro step having a step-terrace structure in which a step having a height of equal to or more than a plurality of molecular layers of GaN and extending in a direction orthogonal to m-axis direction, and a terrace are alternately arranged.

(Supplementary Description 6)
There is provided the GaN laminate according to any one of the supplementary descriptions 1 to 5, wherein a height of a peak-to-valley of an unevenness formed by the macro step and the macro terrace is 10 nm or more.

(Supplementary Description 7) There is provided the GaN laminate according to any one of the supplementary descriptions 1 to 6, wherein a thickness of the GaN layer is 10 μm or more.

(Supplementary Description 8)
There is provided the GaN laminate according to any one of the supplementary descriptions 1 to 7, wherein a region having a size of 1 mm square or more on a surface of the GaN layer has the macro step-macro terrace structure.

(Supplementary Description 9)
There is provided the GaN laminate according to any one of the supplementary descriptions 1 to 8, wherein the substrate is the substrate manufactured by a VAS method (It is the substrate not including a region having a threading dislocation density of $1 \times 10^7/cm^2$ or more).

(Supplementary Description 10)
There is provided a method of manufacturing a GaN laminate, including:
preparing a GaN substrate containing GaN single crystal and having a low index crystal plane as c-plane closest to a main surface; and
eptaxially growing a GaN layer by HVPE on the main surface of the GaN substrate,
wherein in epitaxially growing the GaN layer, the GaN layer is grown, with a growth temperature set to 950° C. or more and 1200° C. or less, and a macro step-macro terrace structure is formed on the surface of the GaN layer, in which a macro step and a macro terrace are alternately arranged,
one of the macro step and the macro terrace has a step-terrace structure in which a step having a height of equal to or more than a plurality of molecular layers of GaN and extending in a direction orthogonal to m-axis direction, and a terrace are alternately arranged, and
the other one of the macro step and the macro terrace has a step-terrace structure in which a step having a height of equal to or more than a plurality of molecular layers of GaN and extending in a direction orthogonal to a-axis direction, and a terrace are alternately arranged.

(Supplementary Description 11)
There is provided the method of manufacturing a GaN laminate according to supplementary description 10, wherein in epitaxially growing the GaN layer, a range of growth temperature Tg and V/III ratio is set to (V/III ratio)≤0.2 Tg−189 and (V/III ratio)≥0.2 Tg−209.

(Supplementary Description 12)
There is provided the method of manufacturing a GaN laminate according to supplementary description 10, wherein in epitaxially growing the GaN layer, a range of growth temperature Tg and V/III ratio is set to (V/(II ratio)≤0.2 Tg−189 and (V/III ratio)≥0.2 Tg−199.

(Supplementary Description 13)
There is provided the method of manufacturing a GaN laminate according to supplementary description 10, wherein in epitaxially growing the GaN layer, a range of growth temperature Tg and V/III ratio is set to (V/III ratio)<0.2 Tg−199 and (V/III ratio)≥0.2 Tg−209.

(Supplementary Description 14)
There is provided the method of manufacturing a GaN laminate according to supplementary description 13, wherein the substrate has a region in the main surface, in which a size of an off-angle is preferably 0.5° or less, more preferably 0.4° or less, the off-angle being the angle formed by a normal direction of the main surface and c-axis direction.

(Supplementary Description 15)
There is provided the method of manufacturing a GaN laminate according to any one of the supplementary descriptions 10 to 14, wherein in epitaxially growing the GaN layer, the GaN layer having a thickness of 10 μm or more is grown.

(Supplementary Description 16)
There is provided the method of manufacturing a GaN laminate according to any one of the supplementary descriptions 10 to 15, wherein in epitaxially growing the GaN layer, the GaN layer is grown at a growth rate of 0.3 μm/minute or more and 3.0 μm/minute or less.

(Supplementary Description 17)
There is provided the method of manufacturing a GaN laminate according to any one of the supplementary descriptions 10 to 16, wherein in epitaxially growing the GaN layer, after supply of the N source gas, supply of hydrogen gas is started, and after supply of the hydrogen gas, supply of Ga source gas is started.

DESCRIPTION OF SIGNS AND NUMERALS

10 GaN substrate (substrate)
11 Main surface of the (substrate 10)
20 GaN layer (epi-layer)
21 Surface of the (epi-layer)
30 GaN laminate (laminate)
40 Macro step-macro terrace structure
41 Macro step
42 Macro terrace
50m m-directional step-terrace structure
51m m-directional step
52m m-directional terrace
50a a-directional step-terrace structure
51a a-directional step
52a a-directional terrace
200 HVPE apparatus

The invention claimed is:
1. A GaN laminate, comprising:
a GaN substrate containing GaN single crystal and having a low index crystal plane as c-plane closest to a main surface; and
a GaN layer epitaxially grown on the main surface of the GaN substrate,
wherein a surface of the GaN layer has a macro step-macro terrace structure in which a macro step and a macro terrace are alternately arranged,
one of the macro step and the macro terrace has a step-terrace structure in which a step having a height of equal to or more than a plurality of molecular layers of GaN and extending in a direction orthogonal to in-axis direction, and a terrace are alternately arranged, and
the other one of the macro step and the macro terrace has a step-terrace structure in which a step having a height of equal to or more than a plurality of molecular layers of GaN and extending in a direction orthogonal to a-axis direction, and a terrace are alternately arranged.

2. The GaN laminate according to claim 1, wherein the macro step and the macro terrace extend in an intermediate direction between m-axis direction and a-axis direction.

3. The GaN laminate according to claim 1, wherein a step interval in the macro step and a step interval in the macro terrace are different from each other.

4. The GaN laminate according to claim 1, wherein the macro step is a surface inclined by 0.5° or more and 0.7° or less with respect to c-plane, the macro step having a step-terrace structure in which a step having a height of equal to or more than a plurality of molecular layers of GaN and extending in a direction orthogonal to m-axis direction, and a terrace are alternately arranged.

5. The GaN laminate according to claim 1, wherein a height of a peak-to-valley of an unevenness formed by the macro step and the macro terrace is 10 nm or more.

6. A method of manufacturing a GaN laminate, comprising:
preparing a GaN substrate containing GaN single crystal and having a low index crystal plane as c-plane closest to a main surface; and
eptaxially growing a GaN layer by HVPE on the main surface of the GaN substrate,
wherein in epitaxially growing the GaN layer, the GaN layer is grown, with a growth temperature set to 950° C. or more and 1200° C. or less, and a macro step-macro terrace structure is formed on the surface of the GaN layer, in which a macro step and a macro terrace are alternately arranged,
the macro step has a step-terrace structure in which a step having a height of equal to or more than a plurality of molecular layers of GaN and extending in a direction orthogonal to m-axis direction, and a terrace are alternately arranged, and
the macro terrace has a step-terrace structure in which a step having a height of equal to or more than a plurality of molecular layers of GaN and extending in a direction orthogonal to a-axis direction, and a terrace are alternately arranged.

7. The method of manufacturing a GaN laminate according to claim 6, wherein in epitaxially growing the GaN layer, a range of growth temperature Tg and V/III ratio is set to (V/III ratio)≤0.2 Tg−180 and (V/III ratio)>0.2 Tg−209.

8. The method of manufacturing a GaN laminate according claim 6, wherein in epitaxially growing the GaN layer, a range of growth temperature Tg and V/III ratio is set to (V/III ratio)≤0.2 Tg−189 and (V/III ratio)≥0.2 Tg−199.

9. The method of manufacturing a GaN laminate according to claim 6, wherein in epitaxially growing the GaN layer, a range of growth temperature Tg and V/III ratio is set to (V/III ratio)<0.2 Tg−199 and (V/III ratio)≥0.2 Tg−209.

10. The method of manufacturing a GaN laminate according to claim 9, wherein the substrate has a region in the main surface, in which a size of an off-angle is 0.5° or less, the off-angle being the angle formed by a normal direction of the main surface and c-axis direction.

* * * * *

UNITED STATES PATENT AND TRADEMARK OFFICE
CERTIFICATE OF CORRECTION

| | |
|---|---|
| PATENT NO. | : 10,707,309 B2 |
| APPLICATION NO. | : 16/284473 |
| DATED | : July 7, 2020 |
| INVENTOR(S) | : Hijime Fujikura |

It is certified that error appears in the above-identified patent and that said Letters Patent is hereby corrected as shown below:

In the Specification

Column 1, Line 30, "well hat kind" should read -- well what kind --

Column 7, Line 52, "step 51 in is" should read -- step 51 m is --

Signed and Sealed this
Thirteenth Day of October, 2020

Andrei Iancu
*Director of the United States Patent and Trademark Office*